(12) United States Patent
Tsuchida et al.

(10) Patent No.: US 7,229,493 B2
(45) Date of Patent: Jun. 12, 2007

(54) 3-5 GROUP COMPOUND SEMICONDUCTOR, PROCESS FOR PRODUCING THE SAME, AND COMPOUND SEMICONDUCTOR ELEMENT USING THE SAME

(75) Inventors: Yoshihiko Tsuchida, Tsukuba (JP); Yoshinobu Ono, Ibaraki (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 10/352,934

(22) Filed: Jan. 29, 2003

(65) Prior Publication Data

US 2003/0153168 A1  Aug. 14, 2003

(30) Foreign Application Priority Data

Jan. 31, 2002 (JP) ............................. 2002-023257
Jan. 31, 2002 (JP) ............................. 2002-023258

(51) Int. Cl.
*H01L 21/265* (2006.01)

(52) U.S. Cl. .................... 117/3; 117/2; 117/84; 117/88; 117/906; 117/952

(58) Field of Classification Search .................... 117/3, 117/84, 88, 906, 952, 2
See application file for complete search history.

(56) References Cited

U.S. PATENT DOCUMENTS 5,902,393 A * 5/1999 Nido et al. ................... 117/2
5,926,726 A * 7/1999 Bour et al. .................. 438/507
6,008,539 A * 12/1999 Shibata et al. .............. 257/745
6,043,140 A * 3/2000 Kawai et al. ............... 438/503
6,291,840 B1 * 9/2001 Uemura et al. ............... 257/94
6,464,793 B1 * 10/2002 Nishizawa et al. .......... 118/725
6,562,129 B2 * 5/2003 Hasegawa et al. .......... 117/105
6,861,340 B2 * 3/2005 Takeya ....................... 438/522

FOREIGN PATENT DOCUMENTS

| JP | 5-183189 A | 7/1993 |
| JP | 8-8460 A | 1/1996 |
| JP | 8-32113 A | 2/1996 |
| JP | 8-125222 A | 5/1996 |
| JP | 8-325094 A | 12/1996 |
| JP | 9-40490 A | 2/1997 |
| JP | 9-129929 A | 5/1997 |
| JP | 9-199758 A | 7/1997 |
| JP | 10-209493 A | 8/1998 |
| JP | 2002026024 A * | 1/2002 |

* cited by examiner

*Primary Examiner*—Yogendra N. Gupta
*Assistant Examiner*—Matthew J. Song
(74) *Attorney, Agent, or Firm*—Birch, Stewart, Kolasch & Birch, LLP

(57) ABSTRACT

Provided is an excellent p-type nitride type 3-5 group compound semiconductor having escellent electrical properties such as a low contact resistance to an electrode metal, a low ohmic property, etc., by heat-treating a nitride type 3-5 group compound semiconductor doped with p-type dopant in an hydrogen-containing gas atmosphere of a specific concentration.

2 Claims, 3 Drawing Sheets

3-5 GROUP COMPOUND SEMICONDUCTOR, PROCESS FOR PRODUCING THE SAME, AND COMPOUND SEMICONDUCTOR ELEMENT USING THE SAME

BACKGROUND OF THE INVENTION

1. Field of the Invention

The present invention relates to a p-type nitride type 3-5 group compound semiconductor, a process for producing the same, and a compound semiconductor element using the same.

2. Description of the Related Art

A 3-5 group compound semiconductor represented by general formula $In_xGa_yAl_zN$ ($x+y+z=1$, $0<=x<=1$, $0<=y<=1$, $0<=z<=1$) called a nitride type 3-5 group compound semiconductor is well-known as a material for light-emitting devices, such as a ultraviolet, blue or green light-emitting diode or a ultraviolet, blue or green laser diode. The x, y and z in the formula show the composition ratios to nitrogen (N), respectively. In this text, x may be referred to as InN mixed crystal ratio, y may be referred to as GaN mixed crystal ratio, and z may be referred to as AlN mixed crystal ratio.

Among nitride type 3-5 group compound semiconductors, especially those containing InN mixed crystal ratio of 10% or more are important especially for display applications, since the emission wavelength in a visible range can be controlled according to InN mixed crystal ratio. As a manufacture method of the nitride type 3-5 group compound semiconductor, a molecular beam epitaxy method (hereinafter, may be referred to as MBE), a metalorganic vapor phase epitaxy method (hereinafter, may be referred to as MOVPE), a hydride vapor phase epitaxy method (hereinafter, may be referred to as HVPE), etc. are known. Among these methods, the MOVPE method is widely adopted, since a uniform crystal growth covering large area can be attained.

As a method for producing a p-type nitride type 3-5 group compound semiconductor, proposed is a method wherein a nitride type 3-5 group compound semiconductor doped with p-type dopant is grown in vapor phase by MOVPE method, and then heat-treatment is conducted at a temperature of 700–1000° C. under inert gas atmosphere such as nitrogen (for example, JP-A-5-183189).

However, a p-type nitride type 3-5 group compound semiconductor obtained by this method has problems in the electrical properties such that the contact resistance with an electrode metal is high, the ohmic property is inadequate, etc., and the improvement of these problems has been desired.

The object of the present invention is to provide a p-type nitride type 3-5 group compound semiconductor which does not have the above problems in the conventional technology, a process of producing the same, and a compound semiconductor element using the same.

SUMMARY OF THE INVENTION

As a result of intensive studies to solve the above problems, the present inventors have found that an excellent p-type nitride type 3-5 group compound semiconductor having escellent electrical properties such as a low contact resistance with an electrode metal, a low ohmic property, etc. can be obtained, by heat-treating a nitride type 3-5 group compound semiconductor doped with p-type dopant in an hydrogen-containing gas atmosphere of a specific concentration, and completed the present invention.

That is, the present invention is a process for producing a p-type 3-5 group compound semiconductor wherein a 3-5 group compound semiconductor represented by general formula $In_xGa_yAl_zN$ ($0<=x<=1$, $0<=y<=1$, $0<=z<=1$, $x+y+z=1$) doped with p-type dopant is heat-treated in a mixed-gas atmosphere of a mixed gas comprising hydrogen-containing gas and a gas inert at a high temperature, and the partial pressure of the hydrogen-containing gas is 0.005–0.2 atm.

Figure 1:
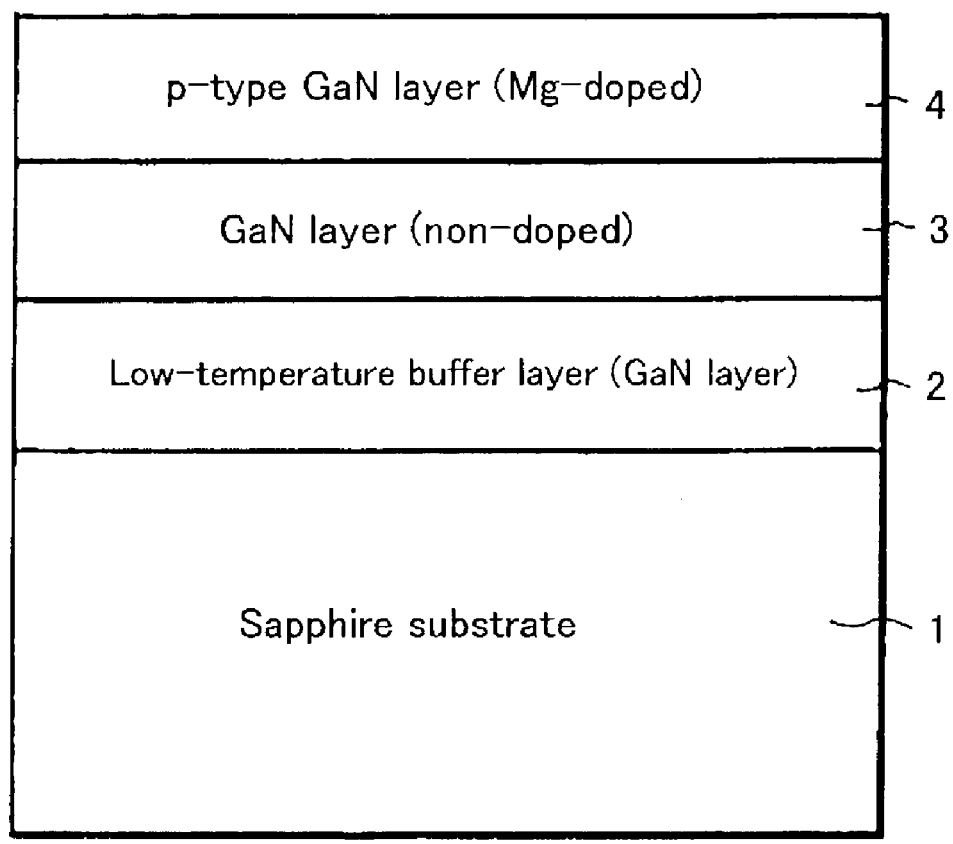
FIG. 1 is a sectional view showing the structure of 3-5 group compound semiconductor in Examples 1–6, 13–33 and Comparative Examples 1–2.

1, 11: Sapphire substrate
2, 12: Low-temperature buffer layer
3, 13: non-doped GaN layer
4, 15, 27: p-type GaN layer
14: $Ga_{0.85}Al_{0.15}N$ Layer
21: Substrate
22: n-type GaN Layer
23: GaN Layer
24: InGaN Layer
25: Multiple Quantum Well Layer
26: Cap Layer

DETAILED DESCRIPTION OF THE INVENTION

Hereafter, an embodiment of the present invention is explained in detail.

The 3-5 group compound semiconductor as the object of the present invention is a 3-5 group compound semiconductor represented by general formula $In_xGa_yAl_zN$ ($x+y+z=1$, $0<=x<=1$, $0<=y<=1$, $0<=z<=1$). Hereinafter, the 3-5 group compound semiconductor represented by the above general formula is sometimes referred to as a nitride type compound semiconductor, or abbreviated simply to a semiconductor.

As the hydrogen-containing gas, ammonia, alkylamine, etc. are exemplified.

The concentration of ammonia is important and a semiconductor having a remarkably reduced contact resistance with an electrode can be obtained where the partial pressure of ammonia is 0.005 to 0.15 atm. The partial pressure is preferably in a range of 0.005 to 0.15 atm., and more preferably 0.01 to 0.1 atm.

The gas inert at a high temperature is a gas inert at a time of heat-treatment, and exemplified are nitrogen, and rare gases such as helium, argon and neon. Of these, helium, argon, and nitrogen are preferable, and nitrogen is the most preferable. These gases can be used alone or in appropriate combination thereof.

The heat-treatment of a nitride type compound semiconductor doped with p-type dopant can be carried out also under a mixed-gas atmosphere of hydrogen-containing gas and a gas inert at a high temperature, and further an oxygen containing gas. Here, as the oxygen containing gas, exemplified are oxygen, ozone, laughing gas, air, carbon dioxide, water vapor ($H_2O$), etc. Among them, oxygen is preferable.

The partial pressure of oxygen containing gas is preferably 0.001–0.5 atm., more preferably 0.001–0.2 atm., and further preferably 0.001–0.1 atm.

The heat-treating temperature is preferably 350–1100° C., and more preferably 600–1000° C. When it is lower than 350° C., the effect of the present invention tends to fall, and when it is higher than 1100° C., the crystallinity of semiconductor tends to deteriorate.

The heat-treating time is usually for about 40 hours or less. It is preferably about 0.1 seconds to 40 hours, more preferably 0.5 seconds to 2 hours, and further preferably 1 second to 30 minutes.

As the heat-treating in the present invention, processings such as heating, keeping warm, etc. are exemplified.

In the present invention, a nitride type compound semiconductor doped with p-type dopant is heat treated under a mixed-gas atmosphere having a specific concentration of nitrogen-containing gas as above. As the nitride type compound semiconductor doped with p-type dopant, those having a p-type dopant concentration of about $5 \times 10^{18}$ to $1 \times 10^{21}$ $cm^{-3}$ are used. The concentration is more preferably about $1 \times 10^{19}$ to $5 \times 10^{20}$ $cm^{-3}$, and further preferably about $2 \times 10^{19}$ to $2 \times 10^{20}$ $cm^{-3}$.

As the p-type dopant, Mg, Zn, Cd, Ca, Be, etc. are exemplified. Among them, Mg is preferable.

The method for producing the above nitride type compound semiconductor doped with p-type dopant is not especially limited, and well-known methods can be used. Among them, preferable are those grown by MOVPE method using an inert gas having substantially no hydrogen as a carrier gas, such as the hydrogen concentration of 0.5% by volume or less. Thus, a semiconductor having further excellent electrical properties can be manufactured. As the inert gas, exemplified are: rare gases, such as helium, argon, and neon; and nitrogen, etc. Among these, helium has a high kinetic viscosity coefficient and can be used preferably as a carrier gas of the present invention. Argon and nitrogen are used in large amount cheaply, and preferable. These gases can be used alone or in appropriate combination thereof.

In the crystal growth of a nitride type compound semiconductor doped with p-type dopant by MOVPE method, the following raw materials can be used.

As the 3 group raw material, exemplified are: trialkyl gallium represented by the general formula $R_1R_2R_3$ Ga ($R_1$, $R_2$, and $R_3$ show an alkyl group having 1–6 carbon atoms) such as trimethyl gallium [$(CH_3)_3Ga$, hereinafter may be referred to as TMG], and triethyl gallium [$(C_2H_5)_3Ga$, hereinafter may be referred to as TEG]; trialkyl aluminum represented by the general formula $R_1R_2R_3$ Al ($R_1$, $R_2$, and $R_3$ show an alkyl group having 1–6 carbon atoms) such as trimethylaluminum [$(CH_3)_3Al$], triethylaluminum [$[(C_2H_5)_3Al$, hereinafter may be referred to as TEA], and tri-isobutyl aluminum [$(i-C_4H_9)_3Al$]; trimethylamine alan [$(CH_3)_3N$:$AlH_3$]; trialkyl indium represented by the general formula $R_1R_2R_3$ In ($R_1$, $R_2$, and $R_3$ show an alkyl group having 1–6 carbon atoms) such as trimethyl indium [$(CH_3)_3In$, hereinafter may be referred to as TMI], and triethyl indium [$(C_2H_5)_3In$] ($R_1$, $R_2$, and $R_3$ show an alkyl group having 1–6 carbon atoms); those 1–3 alkyl groups of trialkyl indium are exchanged with halogen atoms, such as diethyl indium chloride [$(C_2H_5)_2InCl$]; and halogenated indium represented by the general formula InX (X is a halogen atom), such as indium chloride [InCl], etc. These can be used alone or in combination thereof.

As the 5 group raw material, ammonia, hydrazine, methylhydrazine, 1,1-dimethylhydrazine, 1,2-dimethyl hydrazine, t-butyl amine, ethylenediamine, etc. are exemplified. These can be used alone or mixed in appopriete combination thereof. Among these raw materials, ammonia and hydrazine are preferable, since they do not contain carbon atoms in a molecule, and contamination of carbon in a semiconductor is little.

As the raw material of Mg which is a p-type dopant, bis cyclopentadienyl magnesium $(C_5H_5)_2Mg$), bis methylcyclopentadienyl magnesium $((C_5H_4CH_3)_2Mg)$, bis ethylcyclopentadienyl magnesium $((C_5H_4C_2H_5)_2Mg)$, etc. can be used.

As the substrate on which a nitride compound semiconductor is grown, a nitride compound semiconductor, sapphire, SiC, Si, $ZrB_2$, $CrB_2$, etc. can be used suitably. When the compound semiconductor is directly grown on the substrate, crystal having satisfactory quality may not be obtained due to a lattice mismatch etc. In such a case, a layer, such as GaN, AlN, or SiC, as a buffer layer is grown on the substrate first, and then the compound semiconductor is further grown, thus a high quality crystal may be obtained. The compound semiconductor doped with p-type dopant may be grown either directly on the substrate or through a buffer layer on the substrate. Or it may be grown as a laminate further on a nitride compound semiconductor which is grown through the buffer layer on the substrate.

When heat-treatment the nitride type compound semiconductor doped with p-type dopant which is grown by the above methods is conducted in an atmosphere of specific concentration of a hydrogen-containing gas such as ammonia, the heat treatment may be carried out after the growth under a predetermined heating atmosphere. The heat treatment may be also carried out by taking out from the reaction furnace and setting in another furnace, and this furnace may be set to a predetermined heating atmosphere. In the former case, the heat treatment may be also done in a cooling step.

Preparation of excellent ohmic p-electrode is not easy, since the ohmic electrode is sensitive-to the surface, and moreover, hydrogen is apt to remain in the crystal surface. It is considered that by the heat treatment of the present invention, deterioration of the nitride-type semiconductor crystal surface is suppressed, and release of hydrogen from the surface is accelerated, thus a p-type crystal on which excellent ohmic electrode is easily formed can be obtained.

EXAMPLES

Hereafter, the The present invention will be illustrated with reference to the following Examples, without being limited thereto.

(Preparation of p-type Semiconductor)

On a sapphire substrate, by a normal-pressure MOVPE method, a p-type semiconductor having a layered structure shown in FIG. 1 was manufactured as follows.

Cleaning of the plane (0001) of sapphire substrate 1 was carried out at 1060° C. and then it was cooled to 550° C. At this temperature, a GaN layer of about 50 nm thickness was grown as a low-temperature buffer layer 2 on this plane with using hydrogen as a carrier gas, ammonia and TMG as raw material gases. Subsequently, the temperature was raised to 1040° C., non doped GaN layer 3 of about 3.25 μm was grown. And Mg-doped GaN layer 4 of 1 μm was grown on GaN layer 3 at this temperature. In the growth atmosphere of Mg-doped GaN layer 4, the ratio of ammonia in the whole supplying gas was 23% in flow rate. The Mg concentration in the Mg-doped layer was $7 \times 10^{19} cm^{-3}$. After the growth, heating of the substrate was stopped and it was cooled to 600° C., then the supply of ammonia was stopped and cooled to a room temperature. The reaction vessel was evacuated and substituted with nitrogen gas, and then a p-type semiconductor sample (hereinafter, may be referred to as semiconductor 1) was taken out.

Examples 1–6 and Comparative Examples 1 and 2

The semiconductor 1 was divided into some pieces, and used for the following Comparative Examples 1 and 2, and Examples 1–6.

Comparative Example 1

One of the divided samples was heat-treated in 1 atm. nitrogen atmosphere which does not contain ammonia, at a temperature of 800° C. for 20 minutes in a heating furnace. On the sample, Ni 15 nm and Pt 30 nm were deposited, and TLM pattern for contact-resistance measurement was formed. Then, it was made into alloy at 380° C. for 10 minutes to form an electrode to Mg-doped p-type GaN layer 5.

Comparative Example 2

A sample was prepared as the same manner with Comparative Example 1 except that the heat treating temperature was 1000° C.

Examples 1, 3 and 5

Samples were prepared as the same manner with Comparative Example 1 except that the ammonia concentrations in heat-treating atmosphere were, 1%, 5%, and 10%, respectively. Here, in the cooling step after heat-treatment, the supply of ammonia was stopped at a time when cooled to 400° C.

Examples 2, 4 and 6

Samples were prepared as the same manner with Comparative Example 2 except that the ammonia concentrations in the heat-treating atmosphere were, 1%, 5%, and 10%, respectively. Here, in the cooling step after heat-treatment, the supply of ammonia was stopped at a time when cooled to 400° C.

The values of contact resistance obtained by TLM method for Comparative Examples 1 and 2, and Examples 1–6 are shown in Table 1. The value of contact resistance is shown as a relative value to that of Comparative Example 1. From Table 1, the samples heat-treated in an atmosphere having a specific concentration of ammonia have remarkably small contact resistance compared with those heat-treated in an atmosphere not containing ammonia. Thus, the effect of lowering the contact resistance of the electrode by heat-treatment in an atmosphere of specific ammonia concentration is clearly shown.

TABLE 1

| | Heat-treatment time (min) | Heat-treatment temperature (° C.) | $NH_3$ Concentration (%) | Contact resistance |
|---|---|---|---|---|
| Comparative Example 1 | 20 | 800 | 0 | 1 |
| Example 1 | 20 | 800 | 1 | $9.3 \times 10^{-3}$ |
| Example 2 | 20 | 800 | 5 | $4.6 \times 10^{-3}$ |
| Example 3 | 20 | 800 | 10 | $1.1 \times 10^{-2}$ |

TABLE 1-continued

| | Heat-treatment time (min) | Heat-treatment temperature (° C.) | $NH_3$ Concentration (%) | Contact resistance |
|---|---|---|---|---|
| Comparative Example 2 | 20 | 1000 | 0 | $1.3 \times 10^{-1}$ |
| Example 4 | 20 | 1000 | 1 | $3.5 \times 10^{-4}$ |
| Example 5 | 20 | 1000 | 5 | $5.9 \times 10^{-4}$ |
| Example 6 | 20 | 1000 | 10 | $1.3 \times 10^{-3}$ |

(Preparation of p-type Semiconductor)

Figure 2:
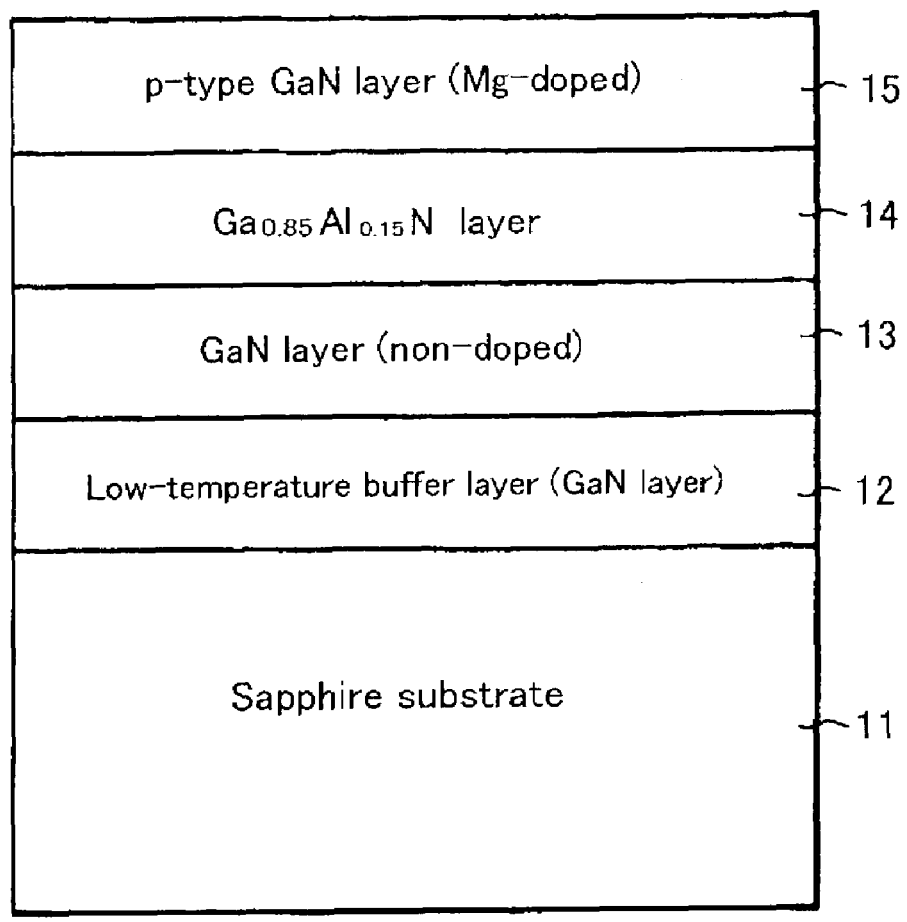
FIG. 2] is a sectional view showing the structure of 3-5 group compound semiconductor in Examples 7–12 Comparative Examples 3.
Figure 3:
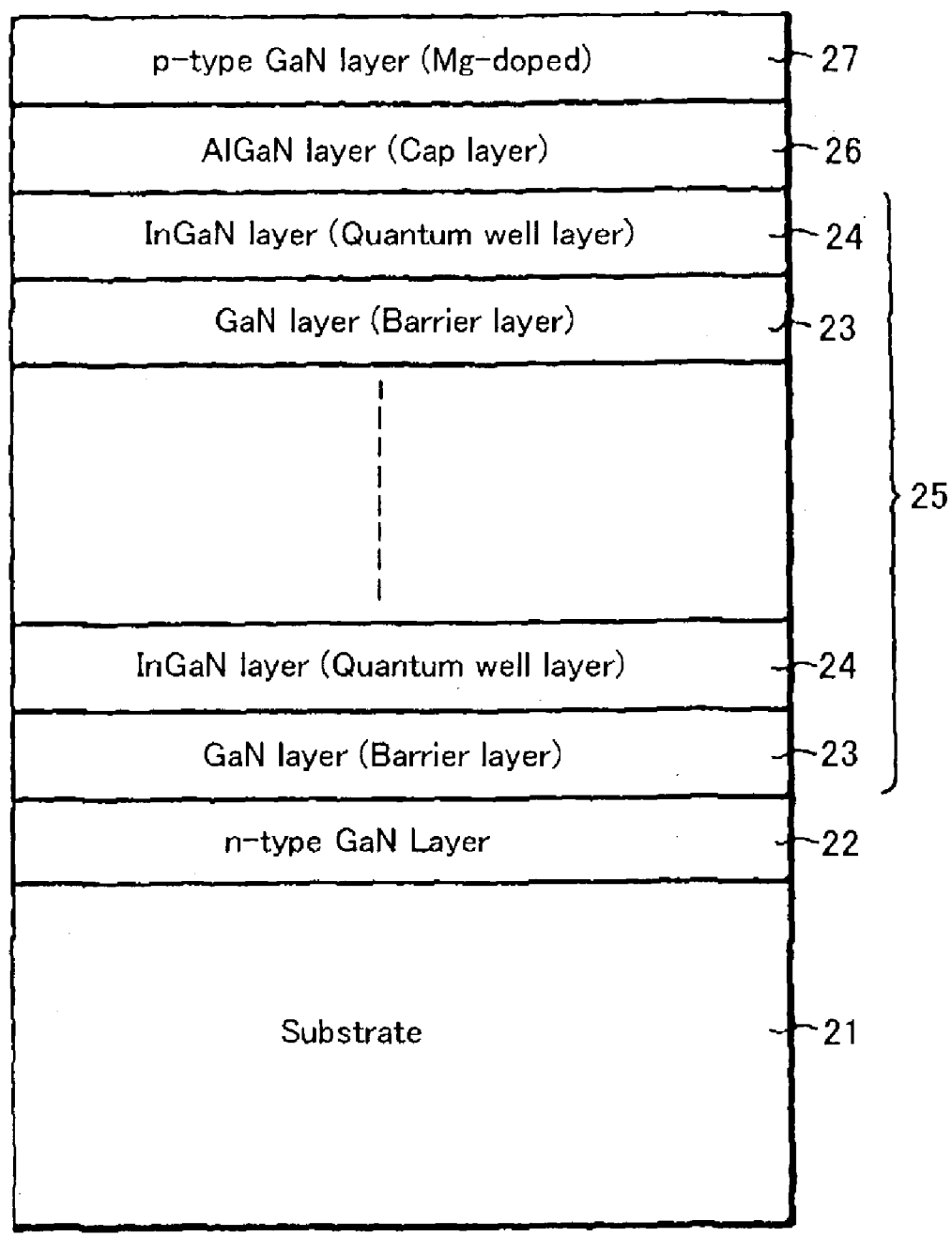
FIG. 3 is a sectional view showing the structure of light-emitting-diode crystal produced using gaseous phase crystal-growth method in the Examples of the present invention.

On a sapphire substrate, by a normal-pressure MOVPE method, a p-type semiconductor having the layered structure shown in FIG. 2 was produced as follows.

A GaN layer of about 50 nm thickness was grown as a low-temperature buffer layer 12 on the plane (0001) of sapphire substrate 11 at 550° C. with using hydrogen as a carrier gas, and ammonia and TMG as raw material gases. Subsequently, a non doped GaN layer 13 of about 3.25 μm was grown at 1040° C.

Then the carrier gas was changed to nitrogen, and growth temperature was cooled to 775° C. After $Ga_{0.85}Al_{0.15}N$ layer 15 was grown to 25 nm in this condition, the growth temperature was raised again and Mg-doped p-type GaN layer 16 was grown to 1 μm at 1040° C. The growth atmosphere of p-type GaN layer 16 was the same with that of p-type GaN layer 5 of Comparative Example 1 except that the carrier gas was nitrogen. The Mg concentration in Mg-doped p-type GaN layer 16 was $7 \times 10^{19} cm^{-3}$. After the growth, heating of the substrate was stopped and cooled to 600° C., then the supply of ammonia was stopped. After cooling to a room temperature, the reaction vessel was evacuated and substituted with nitrogen, and then a p-type semiconductor sample (hereinafter, may be referred to as semiconductor 2) was taken out.

The p-type carrier concentration measured by C-V method was $1.5 \times 10^{15} cm^{-3}$.

Examples 7–12, Comparative Example 3

The above semiconductor 2 was divided into some pieces, and used for the following Examples 7–12 and Comparative Example 3.

Comparative Example 3

One of the divided samples was heat-treated in 1 atm. of nitrogen atmosphere containing 0.8% of oxygen, at a temperature of 1000° C. for 20 minutes in a heat treating furnace. The p-type carrier concentration of the sample measured was $1.2 \times 10^{19} cm^{-3}$.

On the sample, Ni 15 nm and Pt 30 nm were deposited, and TLM pattern for contact-resistance measurement was formed. Then, it was made into alloy at 380° C. for 10 minutes to form an electrode to Mg-doped p-type GaN layer 5. The above obtained p-electrode was evaluated by TLM measurement.

Examples 7, 8 and 9

Three samples were produced as the same manner with Comparative Example 3 except that the ammonia concentrations in the heat-treating atmosphere were, respectively, 1%, 5% and 10%. The evaluation result is shown in Table 2.

Examples 10, 11 and 12

Three samples were produced, respectively as the same manner with Examples 7, 8 and 9, except that 0.8% of oxygen is contained in the heat-treating atmosphere. The evaluation result is shown in Table 2.

TABLE 2

|  | Heat-treatment time (min) | Heat-treatment temp. (° C.) | NH$_3$ Conc. (%) | Oxygen Conc. (%) | Contact resistance |
|---|---|---|---|---|---|
| Example 7 | 20 | 1000 | 1 | 0 | $4.5 \times 10^{-3}$ |
| Example 8 | 20 | 1000 | 5 | 0 | $1.3 \times 10^{-3}$ |
| Example 9 | 20 | 1000 | 10 | 0 | $1.4 \times 10^{-2}$ |
| Example 10 | 20 | 1000 | 1 | 0.8 | $2.8 \times 10^{-2}$ |
| Example 11 | 20 | 1000 | 5 | 0.8 | $2.1 \times 10^{-1}$ |
| Example 12 | 20 | 1000 | 10 | 0.8 | $2.3 \times 10^{-1}$ |
| Comparative Example 3 | 20 | 1000 | 0 | 0.8 | 1 |

Examples 13 to 22

On a sapphire substrate, by a normal-pressure MOVPE method, a p-type semiconductor having a layered structure shown in FIG. 1 was manufactured as follows.

[0027]
Cleaning of the plane (0001) of sapphire substrate 1 was carried out at 1060° C. and then it was cooled to 550° C. At this temperature, a GaN layer of about 50 nm thickness was grown as a low-temperature buffer layer 2 on this plane with using hydrogen as a carrier gas, ammonia and TMG as raw material gases. Subsequently, the temperature was raised to 1040° C., non doped GaN layer 3 of about 3.25 μm was grown. Then the carrier gas was changed to nitrogen, and Mg-doped p-type GaN layer 4 of 1 μm was grown on GaN layer 3 at this temperature. In the growth atmosphere of Mg-doped p-type GaN layer 4, the ratio of ammonia in the whole supplying gas was 23% in flow rate. The Mg concentration in the Mg-doped layer was $7 \times 10^{19}$ cm$^{-3}$. After the growth, heating of the substrate was stopped and it was cooled to 400° C., then the supply of ammonia was stopped and cooled to a room temperature. The reaction vessel was evacuated and substituted with nitrogen gas, and then a p-type semiconductor sample (hereinafter, may be referred to as semiconductor 3) was taken out.

The obtained semiconductor was divided into some pieces, and used for the following Examples 13–22.

Examples 13 to 17

Divided samples were heat-treated in an atmosphere of 1% ammonia, at a temperature of 800° C., respectively for 2 seconds, 10 seconds, 0.8 minutes, 4 minutes and 10 minutes. TML electrode patterns were formed on each of the samples as described in Comparative Example 1, and contact-resistance were measured. The result is shown in Table 3. The value of contact resistance is shown by a relative value to that of Comparative Example 3.

Examples 18 to 22

Divided samples were heat-treated in an atmosphere of 5% ammonia, and 5% oxygen, at a temperature of 800° C., respectively for 2 seconds, 10 seconds, 0.8 minutes, 4 minutes and 20 minutes. The result is shown in Table 3. The value of contact resistance is shown by a relative value to that of Comparative Example 3.

TABLE 3

|  | Heat-treatment time | Heat-treatment temp. (° C.) | NH$_3$ Conc. (%) | Oxygen Conc. (%) | Contact resistance |
|---|---|---|---|---|---|
| Example 13 | 2 sec | 800 | 1 | 0 | $4.2 \times 10^{-4}$ |
| Example 14 | 10 sec | 800 | 1 | 0 | $1.1 \times 10^{-3}$ |
| Example 15 | 0.8 min | 800 | 1 | 0 | $1.1 \times 10^{-3}$ |
| Example 16 | 4 min | 800 | 1 | 0 | $5.3 \times 10^{-4}$ |
| Example 17 | 10 min | 800 | 1 | 0 | $4.2 \times 10^{-2}$ |
| Example 18 | 2 sec | 800 | 5 | 5 | $6.5 \times 10^{-5}$ |
| Example 19 | 10 sec | 800 | 5 | 5 | $3.9 \times 10^{-5}$ |
| Example 20 | 0.8 min | 800 | 5 | 5 | $7.0 \times 10^{-5}$ |
| Example 21 | 4 min | 800 | 5 | 5 | $5.6 \times 10^{-5}$ |
| Example 22 | 20 min | 800 | 5 | 5 | $2.9 \times 10^{-4}$ |

Examples 23 to 33

Crystal growth was carried out as the same manner with that of semiconductor 3.

The obtained semiconductor was divided into some pieces, and the divided samples were heat-treated in a condition shown in Table 4. The result is shown in Table 4. The value of contact resistance is a relative value to Comparative Example 3.

TABLE 4

|  | Heat-treatment time | Heat-treatment temp. (° C.) | NH$_3$ Conc. (%) | Oxygen Conc. (%) | Contact resistance |
|---|---|---|---|---|---|
| Example 23 | 0.8 min | 600 | 1 | 0 | $1.5 \times 10^{-1}$ |
| Example 24 | 0.8 min | 700 | 1 | 0 | $2.7 \times 10^{-2}$ |
| Example 25 | 0.8 min | 800 | 1 | 0 | $1.1 \times 10^{-3}$ |
| Example 26 | 0.8 min | 500 | 5 | 5 | $5.5 \times 10^{-2}$ |
| Example 27 | 0.8 min | 600 | 5 | 5 | $6.4 \times 10^{-5}$ |
| Example 28 | 0.8 min | 700 | 5 | 5 | $2.6 \times 10^{-4}$ |
| Example 29 | 0.8 min | 800 | 5 | 5 | $7.9 \times 10^{-5}$ |
| Example 30 | 0.8 min | 900 | 5 | 5 | $7.0 \times 10^{-5}$ |
| Example 31 | 0.8 min | 800 | 5 | 0.5 | $1.1 \times 10^{-3}$ |
| Example 32 | 0.8 min | 800 | 5 | 1 | $5.8 \times 10^{-4}$ |
| Example 33 | 0.8 min | 800 | 5 | 2 | $3.5 \times 10^{-4}$ |

Example 34

A compound semiconductor having a layered structure shown in FIG. 1 is produced as the same manner with Example 1, except that the cooling step is carried out as follows. After growing step of Mg-doped p-type GaN layer 4 shown in FIG. 1, oxygen is introduced into the reaction furnace, at the same time when the heating of substrate is stopped to start cooling, to make the cooling atmosphere of oxygen concentration of 1%, and the ammonia supply is controlled to adjusted the ammonia concentration to 1%. Cooling is continued in this condition to 400° C., and the supplies of ammonia and oxygen are stopped. After being cooled to a room temperature, the reaction vessel was evacuated and substituted with nitrogen, and then the resulting sample is taken out.

Thus, a p-type semiconductor having satisfactorily high p-type carrier concentration is obtainable.

According to the present invention, a p-type nitride type compound semiconductors having a low contact resistance to electrode metal, and excellent electrical properties of ohmic property can be produced, by heat-treating a nitride type compound semiconductor which is doped with p-type dopant in an atmosphere comprising a specific concentration of hydrogen containing gas such as ammonia. When semiconductor elements, such as a light-emitting diode, are produced using this semiconductor, the electrical property can be remarkably improved, and the electric-power loss in electrode parts can be suppressed low, thus an efficient semiconductor element can be realized.

What is claimed is:

1. A process for producing a p-type 3-5 group compound semiconductor wherein a 3-5 group compound semiconductor represented by general formula $In_xGa_yAl_zN$ ($0<=x<=1$, $0<=y<=1$, $0<=z<=1$, $x+y+z=1$) doped with p-type dopant is heat-treated at 800–1100° C. in a mixed-gas atmosphere comprising a hydrogen-containing gas and a gas inert at a high temperature, wherein the 3-5 group compound semiconductor doped with p-type dopant is manufactured by a metal organic vapor phase epitaxy method using an inert gas which does not contain hydrogen substantially as a carrier gas, and the partial pressure of hydrogen-containing gas is 0.005—0.2 atm, wherein the mixed gas comprises hydrogen-containing gas, a gas inert at high temperature, and further an oxygen-containing gas, and the partial pressure of the oxygen-containing gas is 0.001–0.5 atm, and wherein the hydrogen-containing gas is ammonia.

2. A process for producing a p-type 3-5 group compound semiconductor according to claim 1, wherein the oxygen-containing gas is oxygen.

* * * * *